(12) United States Patent
Liang et al.

(10) Patent No.: US 10,290,627 B2
(45) Date of Patent: May 14, 2019

(54) EMBEDDED HIGH VOLTAGE LDMOS-SCR DEVICE WITH A STRONG VOLTAGE CLAMP AND ESD ROBUSTNESS

(71) Applicant: Jiangnan University, Wuxi (CN)

(72) Inventors: Hailian Liang, Wuxi (CN); Huyun Liu, Wuxi (CN); Xiaofeng Gu, Wuxi (CN); Sheng Ding, Wuxi (CN)

(73) Assignee: JIANGNAN UNIVERSITY, Wuxi (CN)

( * ) Notice: Subject to any disclaimer, the term of this patent is extended or adjusted under 35 U.S.C. 154(b) by 0 days.

(21) Appl. No.: 15/748,492

(22) PCT Filed: Mar. 11, 2016

(86) PCT No.: PCT/CN2016/076111
§ 371 (c)(1),
(2) Date: Jan. 29, 2018

(87) PCT Pub. No.: WO2017/152414
PCT Pub. Date: Sep. 14, 2017

(65) Prior Publication Data
US 2019/0006344 A1    Jan. 3, 2019

(51) Int. Cl.
*H01L 27/02* (2006.01)
*H01L 29/78* (2006.01)

(52) U.S. Cl.
CPC ............ *H01L 27/027* (2013.01); *H01L 27/02* (2013.01); *H01L 29/7826* (2013.01); *H01L 29/7846* (2013.01)

(58) Field of Classification Search
CPC ............... H01L 27/027; H01L 29/7826; H01L 29/7846
See application file for complete search history.

(56) References Cited

U.S. PATENT DOCUMENTS 7,141,831 B1 * 11/2006 Vashchenko ........ H01L 27/0262
257/124
7,659,558 B1 * 2/2010 Walker ................ H01L 27/0262
257/173
(Continued)

FOREIGN PATENT DOCUMENTS

CN          1667826 A     9/2005
CN        102376761 A     3/2012
(Continued)

*Primary Examiner* — Sitaramarao S Yechuri
(74) *Attorney, Agent, or Firm* — Na Xu; IPro, PLLC

(57) ABSTRACT

The present invention provides an embedded high voltage LDMOS-SCR device with strong voltage clamp and ESD robustness, which can be used as the on-chip ESD protection for high voltage IC. Wherein said the device comprises a P substrate, a P well, a N well, a first field oxide isolation region, a first P+ injection region, a second field oxide isolation region, a first N+ injection region, a first fin polysilicon gate, a second N+ injection region, a second fin polysilicon gate, a third N+ injection region, a third fin polysilicon gate, a polysilicon gate, a fourth fin polysilicon gate, a second P+ injection region, a fifth fin polysilicon gate, a third P+ injection region, a sixth fin polysilicon gate, a fourth P+ injection region, a third oxygen isolation region, a fourth N+ injection region and a fourth field oxygen isolation region. Under the influence of ESD pulse, the ESD discharge current path with LDMOS-SCR structure and the RC coupling current path with embedded PMOS interdigital structure in the drain terminal and embedded NMOS interdigital structure in the source terminal are formed, in order to enhance the ESD robustness of the device and improve the voltage clamp capability.

4 Claims, 2 Drawing Sheets

(56) References Cited

U.S. PATENT DOCUMENTS 7,763,908 B2 * 7/2010 Chen ................ H01L 29/87
          257/107
2011/0241069 A1 * 10/2011 Vashchenko ........ H01L 27/0262
          257/140

FOREIGN PATENT DOCUMENTS

| CN | 102593119 A | 7/2012 |
| CN | 103258814 A | 8/2013 |
| CN | 105390491 A | 3/2016 |
| CN | 205385023 U | 7/2016 |

* cited by examiner

EMBEDDED HIGH VOLTAGE LDMOS-SCR DEVICE WITH A STRONG VOLTAGE CLAMP AND ESD ROBUSTNESS

TECHNICAL FIELD

The present invention belongs to the field of ESD protection for IC, relates to the device of high voltage ESD protection, and more particularly relates to an embedded high voltage LDMOS-SCR device with strong voltage clamp and ESD robustness, which can be used to improve the reliability of on-chip ESD protection for high voltage IC.

BACKGROUND

With the continuous improvement of semiconductor integration technology, the circuit system is developing toward to the direction of high density and integration. In order to meet the requirement of high integration, the integration technology of power semiconductor is widely used in circuit system. The damage of Electrostatic discharge named as ESD (Electro-Static discharge) to CMOS integrated circuit has attracted the attention of electronic engineers and researchers, and the traditional protection methods and measures of low voltage ESD have achieved some effects. Due to the introduction of integration technology of power semiconductor, the working voltage of the circuit system is continuously increasing, the traditional protection methods and measures of low voltage ESD can not be simply transplanted into the IC system of power semiconductor nowadays. The ESD protection of power semiconductor IC or on-chip high voltage IC has become an important issue and research focus in the field of ESD protection. The high voltage IC usually works in high voltage, high current, strong electromagnetic interference, frequent hot plug, ultra higher or lower than room temperature and other high-intensity environment, on-chip ESD protection of high voltage IC is facing a more severely challenges. Therefore, designers need to make additional technical considerations when designing ESD protection for power IC.

The laterally diffused metal oxide semiconductor named as LDMOS is usually used as the driven transistor of the circuit load and ESD self-protection device at the output of high voltage IC, due to the high voltage endurance capability and low on-resistance. However, the application of LDMOS used as ESD protection is more restricted by the weakened voltage endurance capability and ESD robustness per area, resulting by the continuously decreased feature size of the IC fabricated process, as well as the chip area. Therefore, the LDMOS is becoming more difficult to meet the ESD protection standards named as the IEC6000-4-2, required by International Electrotechnical Commission, and the ESD protection capability of electronic products should be no less than 2000 V measured by the human body model. After trial and error, researchers found that the embedded SCR of LDMOS structure named as LDMOS-SCR, was significantly helpful to improve the ESD robustness of devices. However, the holding voltage reduced remarkably when the LDMOS-SCR turned on under the ESD pulse stress, and results in the easier latch-up effect risk. If the holding voltage or current of the LDMOS-SCR device can be improved up to the normal operation voltage or current of the protected circuits, the latch-up risk can be effectively avoided. This invention provides an embedded high voltage LDMOS-SCR device with high holding voltage and current, strong voltage clamp and ESD robustness, by combining the strong robustness of LDMOS-SCR and the large capacitance of interdigital MOS structure. Under the ESD pulse stress, the invented ESD high voltage protection device will form a ESD current discharge path with LDMOS-SCR structure, which can enhance the current discharge capability and ESD robustness of the device. In addition, the resistance capacitance coupling current discharge path resulted by the embedded PMOS and NMOS interdigital structure will help to trigger the device and turn on quickly when the ESD pulse is approaching. Moreover, the interdigital structure of PMOS and NMOS increases the parasitic capacitance, the turn-on speed and the trigger current of the device. On the other hand, when the device is turned on, the holding current increases, and the emission rate of electron and hole in the path of SCR device can be reduced, thereby holding voltage and the voltage clamp capability of the device are enhanced.

SUMMARY

Aimed at the problem of the low holding voltage, the weakened capability of the latch-up free, the voltage endurance and voltage clamp of on-chip ESD protection devices in current high voltage IC, this invention provides an embedded high voltage LDMOS-SCR device with strong voltage clamp and ESD robustness. It takes full advantage of not only the high voltage resistance and strong ESD robustness of LDMOS-SCR devices, but also the parasitic effect of large capacitance of embedded PMOS and NMOS interdigital structure, to form the embedded high voltage LDMOS-SCR device with the ESD current conduction path of LDMOS-SCR structure and the parasitic RC coupling current conduction path of the embedded PMOS and NMOS interdigital structure. This invention can increase the holding voltage and current of device, enhance anti-latch-up capability and ESD robustness of device, which applies to on-chip ESD protection for high voltage IC.

The invention is realized by the following technical schemes:

An embedded high voltage LDMOS-SCR device with strong voltage clamp and ESD robustness, including the ESD discharge current path with LDMOS-SCR structure, the RC coupling current path with embedded PMOS interdigital structure in the drain terminal and embedded NMOS interdigital structure in the source terminal, to enhance the ESD robustness of the device and improve the voltage clamp capability. Wherein said the device comprises a P substrate, a P well, a N well, a first field oxide isolation region, a first P+ injection region, a second field oxide isolation region, a first N+ injection region, a first fin polysilicon gate, a second N+ injection region, a second fin polysilicon gate, a third N+ injection region, a third fin polysilicon gate, a polysilicon gate, a fourth fin polysilicon gate, a second P+ injection region, a fifth fin polysilicon gate, a third P+ injection region, a sixth fin polysilicon gate, a fourth P+ injection region, a third oxygen isolation region, a fourth N+ injection region and a fourth field oxygen isolation region.

Wherein said the P well and the N well are successively arranged from left to right on the surface of the P substrate. The left edge of the P substrate is connected to the left edge of the P well. The right side of the P well is connected to the left side of the N well. The right side of the N well is connected to the right edge of the P substrate.

Wherein said the first field oxygen isolation region, the first P+ injection region, the second field field oxygen isolation region and the embedded NMOS interdigital structure are successively arranged from left to right on the surface of the P well. Wherein said the embedded NMOS interdigital structure comprises the first N+ injection region, the first fin polysilicon gate, the second N+ injection region, the second fin polysilicon gate, the third N+ injection region and the third fin polysilicon gate. Within the width range, the device can be alternately extended from a N+ injection region and a fin polysilicon gate along the width direction according to the actual requirements. The left side of the first field oxygen isolation region is connected to the left edge of the P well. The right side of the first field oxygen isolation region is connected to the left side of the first P+ injection region. The right side of the first P+ injection region is connected to the left side of the second field oxygen isolation region. The right side of the second field oxygen isolation region is connected to the left side of the embedded NMOS interdigital structure.

Wherein said the third field oxygen isolation region, the fourth N+ injection region, the fourth field oxygen isolation region and the embedded PMOS interdigital structure are successively arranged from left to right on the surface of the N well. Wherein said the embedded PMOS interdigital structure comprises the fourth fin polysilicon gate, the second P+ injection region, the fifth fin polysilicon gate, the third P+ injection region, the sixth fin polysilicon gate and the fourth P+ injection region. Within the width range, the device can be alternately extended from a P+ injection region and a fin polysilicon gate along the width direction according to the actual requirements. The right side of the embedded PMOS interdigital structure is connected to the left side of the third field oxygen isolation region. The right side of the third field oxygen isolation region is connected to the left side of the fourth N+ injection region. The right side of the fourth N+ injection region is connected to the left side of the fourth field oxygen isolation region. The right side of the fourth field oxygen isolation region is connected to the right edge of the N well.

Wherein said the polysilicon gate stretches across the partial surface of the P well and the N well. The left side of the polysilicon gate is connected to the right side of the embedded NMOS interdigital structure. The right side of the polysilicon gate is connected to the left side of the embedded PMOS interdigital structure.

The first P+ injection region is connected to a first metal 1, the first N+ injection region is connected to a second metal 1. The first fin polysilicon gate is connected to a third metal 1. The second N+ injection region is connected to a fourth metal 1. The second fin polysilicon gate is connected to a fifth metal 1. The third N+ injection region is connected to a sixth metal 1. The third fin polysilicon gate is connected to a seventh metal 1. The polysilicon gate is connected to an eighth metal 1. The fourth fin polysilicon gate is connected to a ninth metal 1. The second P+ injection region is connected to a tenth metal 1. The fifth fin polysilicon gate is connected to an eleventh metal 1. The third P+ injection region is connected to a twelfth metal 1. The sixth fin polysilicon gate is connected to a thirteenth metal 1. The fourth P+ injection region is connected to a fourteenth metal 1. The fourth N+ injection region is connected to a fifteenth metal 1.

Wherein said the first metal 1, the second metal 1, the third metal 1, the fifth metal 1, the sixth metal 1, the seventh metal 1 are all connected to a first metal 2, an electrode extracted from the first metal 2 is used as the metal cathode of the device.

Wherein said the eighth metal 1, the ninth metal 1, the tenth metal 1, the eleventh metal 1, the thirteenth metal 1, the fourteenth metal 1 and the fifteenth metal are all connected to a second metal 2, an electrode extracted from the second metal 2 is used as the metal anode of the device.

Wherein said the fourth metal 1 is connected to a third metal 2, and the twelfth metal 1 is connected to the third metal 2.

The beneficial effects of this invention are as follows:

(1) In the drain religion of the device, the embedded PMOS interdigital structure comprises the fourth fin polysilicon gate, the second P+ injection region, the fifth fin polysilicon gate, the third P+ injection region, the sixth fin polysilicon gate and the fourth P+ injection region. Wherein said the embedded PMOS interdigital structure can increase the holding voltage and enhance the voltage clamp capability of the device.

(2) In the source terminal, the embedded NMOS interdigital structure comprises the first N+ injection region, the first fin polysilicon gate, the second N+ injection region, the second fin polysilicon gate, the third N+ injection region and the third fin polysilicon gate. Wherein said the embedded NMOS interdigital structure can reduce the trigger voltage of the device, and increase the ESD robustness and voltage clamp capability of the device.

(3) Wherein said the embedded PMOS interdigital structure and the embedded NMOS interdigital structure can increase the parasitic capacitance of the device. Under the influence of transient ESD pulse, the trigger current of parasitic resistance in P well and N well can be increased and the trigger voltage of the device can be reduced due to the RC coupling effect. As a result, the voltage clamp capability of the device is enhanced and the current conduction uniformity of the device can be improved.

DETAILED DESCRIPTION

With the drawings and a specific embodiment, the present invention is further described in detail.

The present invention provides an embedded high voltage LDMOS-SCR device with strong voltage clamp and ESD robustness. By combining the strong ESD robustness of the LDMOS-SCR structure and the advantages of large parasitic capacitance of embedded PMOS and NMOS interdigital structure, the capability of voltage clamp and the latch-up free under the high voltage ESD pulse stress is enhanced.

Figure 1:
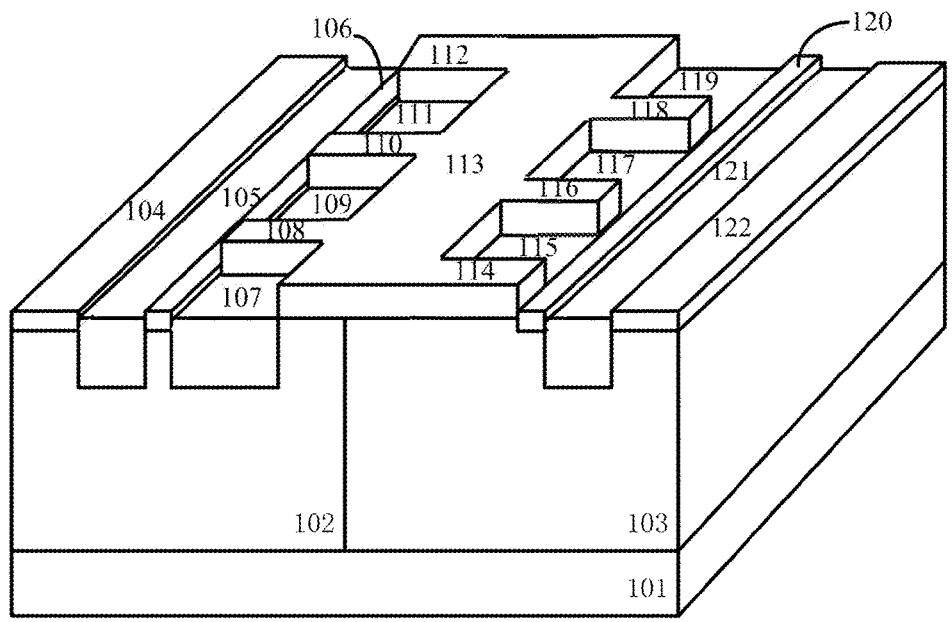
FIG. 1 is a three dimensional diagram illustrating the device structure in a preferred embodiment.

FIG. 1 is the three dimensional diagram illustrating the device structure, in particular to an embedded high voltage LDMOS-SCR device with strong voltage clamp and ESD robustness. This device includes the ESD discharge current path with LDMOS-SCR structure, the RC coupling current path with embedded PMOS interdigital structure in the drain terminal and embedded NMOS interdigital structure in the source terminal. Wherein said the device can enhance the ESD robustness of the device and improve the voltage clamp capability and the turn-on speed of the device. Wherein said the device comprises a P substrate 101, a P well 102, a N well 103, a first field oxide isolation region 104, a first P+ injection region 105, a second field oxide isolation region 106, a first N+ injection region 107, a first fin polysilicon gate 108, a second N+ injection region 109, a second fin polysilicon gate 110, a third N+ injection region 111, a third fin polysilicon gate 112, a polysilicon gate 113, a fourth fin polysilicon gate 114, a second P+ injection region 115, a fifth fin polysilicon gate 116, a third P+ injection region 117, a sixth fin polysilicon gate 118, a fourth P+ injection region 119, a third oxygen isolation region 120, a fourth N+ injection region 121 and a fourth field oxygen isolation region 122.

Wherein said the P well 102 and the N 103 well are successively arranged from left to right on the surface of the P substrate 101. The left edge of the P substrate 101 is connected to the left edge of the P well 102. The right side of the P well 102 is connected to the left of the N well 103. The right side of the N well 103 is connected to the right edge of the P substrate 101.

Wherein said the first field oxygen isolation region 104, the first P+ injection region 105, the second field field oxygen isolation region 106 and the embedded NMOS interdigital structure are successively arranged from left to right on the surface of the P well 102. Wherein said the embedded NMOS interdigital structure comprises the first N+ injection region 107, the first fin polysilicon gate 108, the second N+ injection region 109, the second fin polysilicon gate 110, the third N+ injection region 111 and the third fin polysilicon gate 112. Within the width range, the device can be alternately extended from a N+ injection region and a fin polysilicon gate along the width direction according to the actual requirements. The left side of the first field oxygen isolation region 104 is connected to the left edge of the P well 102. The right side of the first field oxygen isolation region 104 is connected to the left side of the first P+ injection region 105. The right side of the first P+ injection region 105 is connected to the left side of the second field oxygen isolation region 106. The right side of the second field oxygen isolation region 106 is connected to the left side of the embedded NMOS interdigital structure.

Wherein said the third field oxygen isolation region 120, the fourth N+ injection region 121, the fourth field oxygen isolation region 122 and the embedded PMOS interdigital structure are successively arranged from left to right on the surface of the N well 103. Wherein said the embedded PMOS interdigital structure comprises the fourth fin polysilicon gate 114, the second P+ injection region 115, the fifth fin polysilicon gate 116, the third P+ injection region 117, the sixth fin polysilicon gate 118 and the fourth P+ injection region 119. Within the width range, the device can be alternately extended from a P+ injection region and a fin polysilicon gate along the width direction according to the actual requirements. The right side of the embedded PMOS interdigital structure is connected to the left side of the third field oxygen isolation region 120. The right side of the third field oxygen isolation region 120 is connected to the left side of the fourth N+ injection region 121. The right side of the fourth N+ injection region 121 is connected to the left side of the fourth field oxygen isolation region 122. The right side of the fourth field oxygen isolation region 122 is connected to the right edge of the N well 103.

Wherein said the polysilicon gate 113 stretches across the partial surface of the P well 102 and the N well 103. The left side of the polysilicon gate 113 is connected to the right side of the embedded NMOS interdigital structure. The right side of the polysilicon gate 113 is connected to the left side of the embedded PMOS interdigital structure.

Figure 2:
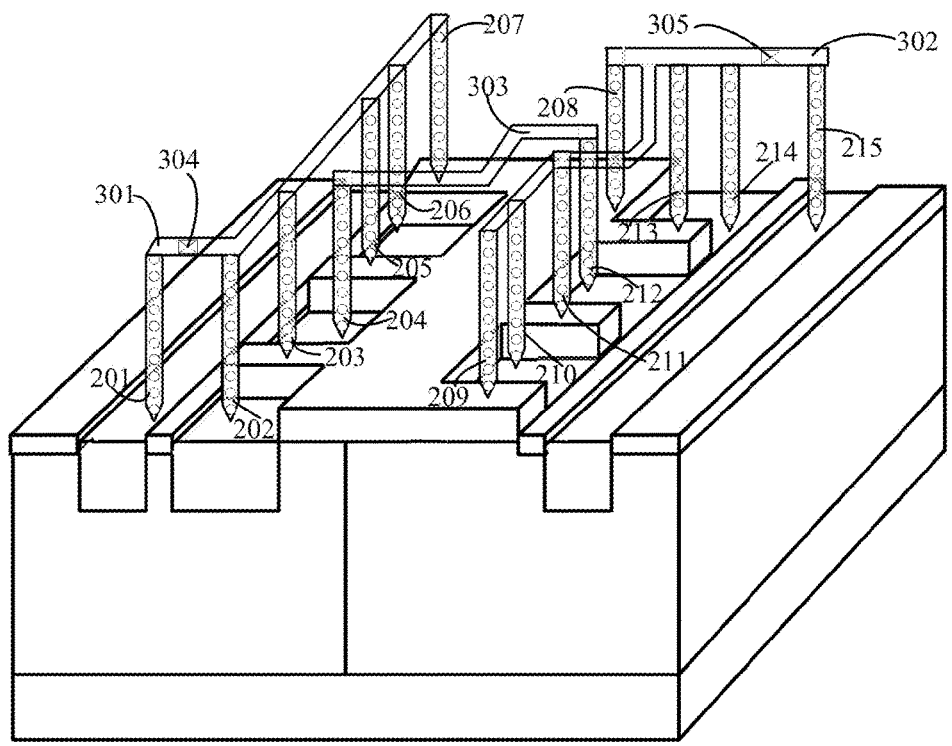
FIG. 2 is a diagram illustrating the metal connection of the device in a preferred embodiment.

As shown in FIG. 2, the first P+ injection region 105 is connected to a first metal 1 201. The first N+ injection region 107 is connected to a second metal 1 202. The first fin polysilicon gate 108 is connected to a third metal 1 203. The second N+ injection region 109 is connected to a fourth metal 1 204. The second fin polysilicon gate 110 is connected to a fifth metal 1 205. The third N+ injection region 111 is connected to a sixth metal 1 206. The third fin polysilicon gate 112 is connected to a seventh metal 1 207. The polysilicon gate 113 is connected to an eighth metal 1 208. The fourth fin polysilicon gate 114 is connected to a ninth metal 1 209. The second P+ injection region 115 is connected to a tenth metal 1 210. The fifth fin polysilicon gate 116 is connected to an eleventh metal 1 211. The third P+ injection region 117 is connected to a twelfth metal 1 212. The sixth fin polysilicon gate 118 is connected to a thirteenth metal 1 213. The fourth P+ injection region 119 is connected to a fourteenth metal 1 214. The fourth N+ injection region 121 is connected to a fifteenth metal 1 215.

Wherein said the first metal 1 201, the second metal 1 202, the third metal 1 203, the fifth metal 1 205, the sixth metal 1 206, the seventh metal 1 207 are all connected to a first metal 2 301, an electrode 304 extracted from the first metal 2 301 is used as the metal cathode of the device.

Wherein said the eighth metal 1 208, the ninth metal 1 209, the tenth metal 1 210, the eleventh metal 1 211, the thirteenth metal 1 213, the fourteenth metal 1 214 and the fifteenth metal 215 are all connected to a second metal 2 302, an electrode 305 extracted from the second metal 2 302 is used as the metal anode of the device.

Wherein said the fourth metal 1 204 is connected to a third metal 2 303, and the twelfth metal 1 212 is connected to the third metal 2 303.

Figure 3:
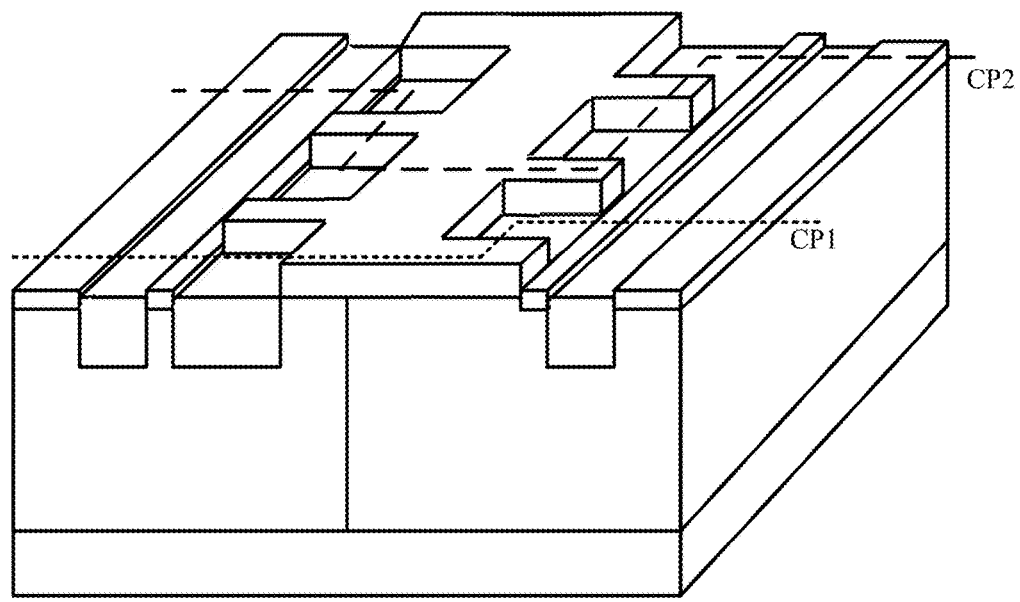
FIG. 3 is a diagram illustrating the ESD discharge current path CP1 and CP2 under the action of ESD pulse in a preferred embodiment.

As shown in FIG. 3, the ESD discharge current path CP1 with LDMOS-SCR structure comprising the metal anode, the N well 103, the fourth N+ injection region 121, the second P+ injection region 115, the fourth fin polysilicon gate 114, the polysilicon gate 113, the P well 102, the first N+ injection region 107, the first P+ injection region 105 and the metal cathode, can enhance the secondary failure current and voltage clamp capability of the device.

The RC coupling current path CP2 with embedded PMOS interdigital structure in the drain terminal and embedded NMOS interdigital structure in the source terminal comprises the metal anode, the N well 103, the fourth N+ injection region 121, the fourth P+ injection region 119, the sixth fin polysilicon gate 118, the third P+ injection region 117, the P well 102, the second N+ injection region 109, the second fin polysilicon gate 110, the third N+ injection region 111, the first P+ injection region 105 and the metal cathode. Because of the fin-type embedded NMOS interdigital structure and the embedded PMOS interdigital structure, parasitic capacitance on the surface of device can be increased, thereby the trigger current and the turn-on speed of the device can also be improved.

Figure 4:
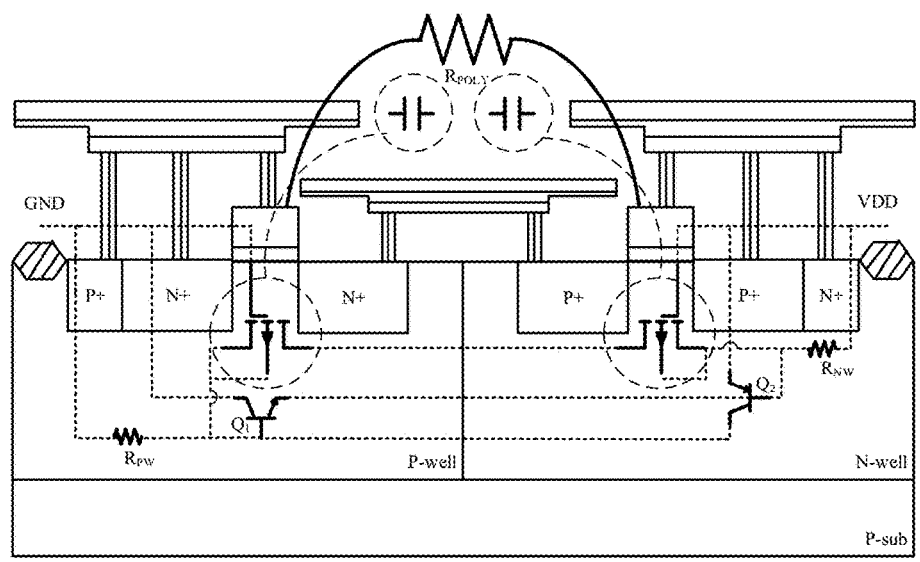
FIG. 4 is a diagram illustrating the section structure of discharge current path CP1 and its internal equivalent circuit under the action of the ESD pulse.

As shown in FIG. 4, when the ESD pulse acts on the device, the equivalent parasitic capacitance Cp with embedded PMOS interdigital structure is formed by comprising the N well 103, the fourth P+ injection region 119, the sixth fin polysilicon gate 118 and the third P+ injection region 117. The equivalent parasitic capacitance Cn with embedded NMOS interdigital structure is formed by comprising the P well 102, the second N+ injection region 109, the second fin polysilicon gate 110 and the third N+ injection region 111. Wherein said the equivalent parasitic capacitance Cp and the well resistance $R_{NW}$ of the N well 103 can form as the first RC coupling effect. Wherein said the equivalent parasitic capacitance Cn and the well resistance $R_{PW}$ of the P well 102 can form as the second RC coupling effect. Under the combined influence of the first RC coupling effect and the second RC coupling effect, the current on parasitic resistance of the P well 102 and the N well 103 can be increased. When the voltage of the $R_{NW}$ or the $R_{PW}$ rapidly increase to 0.7 V, the parasitic transistor Q1 or Q2 inside the structure of LDMOS-SCR turn on, thus forming the ESD discharge current path CP1, so as to improve the holding voltage and current of the device. The polysilicon 113 is represented by distributed resistance $R_{POLY}$ in FIG. 4. At a certain frequency, the resistance value of $R_{POLY}$ is very large and $R_{POLY}$ is almost an open circuit.

While the present invention has been described in some detail for purposes of clarity and understanding, one skilled in the art will appreciate that various changes in form and detail can be made without departing from the true scope of the invention. All figures, tables, appendices, patents, patent applications and publications, referred to above, are hereby incorporated by reference.

What is claimed is:

1. An embedded high voltage LDMOS-SCR device with a strong voltage clamp and ESD robustness, comprising a RC coupling current path of interdigital structure which combines an embedded NMOS in a source terminal and an embedded PMOS in a drain terminal, and a ESD discharge current path of LDMOS-SCR structure, in order to enhance a ESD robustness of the device and voltage clamp capability;

wherein the device further comprises a P substrate, a P well, a N well, a first field oxygen isolation region, a first P+ injection region, a second field oxygen isolation region, a first N+ injection region, a first fin polysilicon gate, a second N+ injection region, a second fin polysilicon gate, a third N+ injection region, a third fin polysilicon gate, a polysilicon gate, a fourth fin polysilicon gate, a second P+ injection region, a fifth fin polysilicon gate, a third P+ injection region, a sixth fin polysilicon gate, a fourth P+ injection region, a third field oxygen isolation region, a fourth N+ injection region and a fourth field oxygen isolation region;

wherein the P well and the N well are successively arranged from left to right on a surface of the P substrate, a left edge of the P substrate is connected to a left edge of the P well, a right side of the P well is connected to a left of the N well, and a right side of the N well is connected to a right edge of the P substrate;

wherein the first field oxygen isolation region, the first P+ injection region, the second field oxygen isolation region and an embedded NMOS interdigital structure are successively arranged from left to right on a surface of the P well; wherein the embedded NMOS interdigital structure comprises the first N+ injection region, the first fin polysilicon gate, the second N+ injection region, the second fin polysilicon gate, the third N+ injection region and the third fin polysilicon gate; wherein within a width range, the device is capable to be alternately extended from a N+ injection region and a fin polysilicon gate along the width direction according to an actual requirements; wherein a left side of the first field oxygen isolation region is connected to a left edge of the P well, a right side of the first field oxygen isolation region is connected to a left side of the first P+ injection region, a right side of the first P+ injection region is connected to a left side of the second field oxygen isolation region, and a right side of the second field oxygen isolation region is connected to a left side of the embedded NMOS interdigital structure;

wherein the third field oxygen isolation region, the fourth N+ injection region, the fourth field oxygen isolation region and an embedded PMOS interdigital structure are successively arranged from left to right on a surface of the N well; wherein the embedded PMOS interdigital structure comprises the fourth fin polysilicon gate, the second P+ injection region, the fifth fin polysilicon gate, the third P+ injection region, the sixth fin polysilicon gate and the fourth P+ injection region; wherein within a width range, the device is capable to be alternately extended from a P+ injection region and a fin polysilicon gate along the width direction according to an actual requirements; wherein a right side of the embedded PMOS interdigital structure is connected to the left side of a third field oxygen isolation region, a right side of the third field oxygen isolation region is connected to a left side of the fourth N+ injection region, a right side of the fourth N+ injection region is connected to a left side of the fourth field oxygen isolation region, and a right side of the fourth field oxygen isolation region is connected to a right edge of the N well;

wherein the polysilicon gate is configured to stretch across a partial surface of the P well and the N well, a left side of the polysilicon gate is connected to a right side of the embedded NMOS interdigital structure, and a right side of the polysilicon gate is connected to a left side of the embedded PMOS interdigital structure;

wherein the first P+ injection region is connected to a first metal 1, the first N+ injection region is connected to a second metal 1, the first fin polysilicon gate is connected to a third metal 1, the second N+ injection region is connected to a fourth metal 1, the second fin polysilicon gate is connected to a fifth metal 1, the third N+ injection region is connected to a sixth metal 1, the third fin polysilicon gate is connected to a seventh metal 1, the polysilicon gate is connected to an eighth metal 1, the fourth fin polysilicon gate is connected to a ninth metal 1, the second P+ injection region is connected to a tenth metal 1, the fifth fin polysilicon gate is connected to an eleventh metal 1, the third P+ injection region is connected to a twelfth metal 1, the sixth fin polysilicon gate is connected to a thirteenth metal 1, the fourth P+ injection region is connected to a fourteenth metal 1, and the fourth N+ injection region is connected to a fifteenth metal 1;

wherein the first metal 1, the second metal 1, the third metal 1, the fifth metal 1, the sixth metal 1, the seventh metal 1 are all connected to a first metal 2, and an electrode extracted from the first metal 2 is configured to be used as the metal cathode of the device;

wherein the eighth metal 1, the ninth metal 1, the tenth metal 1, the eleventh metal 1, the thirteenth metal 1, the fourteenth metal 1 and the fifteenth metal are all connected to a second metal 2, and an electrode extracted from the second metal 2 is configured to be used as the metal anode of the device;

wherein the fourth metal 1 is connected to a third metal 2, and the twelfth metal 1 is connected to the third metal 2.

2. The device of claim 1, capable to set a high holding voltage and provide a high voltage clamp capability.

3. The device of claim 1, capable to set a low trigger voltage, and provide a high ESD robustness and voltage clamp capability.

4. The device of claim 1, wherein the embedded PMOS interdigital structure and the embedded NMOS interdigital structure are capable to set high parasitic capacitance, and under the influence of transient ESD pulse, a trigger current of parasitic resistance in P well and N well is capable to be set to high due to a RC coupling effect, and a trigger voltage of the device is capable to be set to low.

\* \* \* \* \*